(12) United States Patent
Magri' et al.

(10) Patent No.: US 9,520,468 B2
(45) Date of Patent: *Dec. 13, 2016

(54) INTEGRATED POWER DEVICE ON A SEMICONDUCTOR SUBSTRATE HAVING AN IMPROVED TRENCH GATE STRUCTURE

(71) Applicant: STMICROELECTRONICS S.r.l., Agrate Brianza (IT)

(72) Inventors: Angelo Magri', Belpasso (IT); Antonino Sebastiano Alessandria, Catania (IT); Stefania Fortuna, Aci Bonaccorsi (IT); Leonardo Fragapane, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 27 days.

This patent is subject to a terminal disclaimer.

(21) Appl. No.: 14/166,075

(22) Filed: Jan. 28, 2014

(65) Prior Publication Data

US 2014/0138739 A1 May 22, 2014

Related U.S. Application Data

(62) Division of application No. 12/645,255, filed on Dec. 22, 2009, now Pat. No. 8,664,713.

(30) Foreign Application Priority Data

Dec. 31, 2008 (IT) .............................. MI2008A2361

(51) Int. Cl.
*H01L 29/66* (2006.01)
*H01L 29/10* (2006.01)
(Continued)

(52) U.S. Cl.
CPC ......... *H01L 29/1037* (2013.01); *H01L 29/405* (2013.01); *H01L 29/407* (2013.01);
(Continued)

(58) Field of Classification Search
CPC ... H01L 29/405; H01L 29/407; H01L 29/4236
(Continued)

(56) References Cited

U.S. PATENT DOCUMENTS 5,326,711 A 7/1994 Malhi
6,225,161 B1 5/2001 Liu
(Continued)

FOREIGN PATENT DOCUMENTS

EP 1351313 10/2003
EP 1536480 6/2005
(Continued)

OTHER PUBLICATIONS

Italian Search Report for Italian Patent Application No. IT2008MI02361, Ministero dello Sviluppo Economico, Jul. 15, 2009.

*Primary Examiner* — Robert Huber
(74) *Attorney, Agent, or Firm* — Allen, Dyer, Doppelt, Milbrath & Gilchrist, P.A.

(57) ABSTRACT

A power device integrated on a semiconductor substrate and having a plurality of conductive bridges within a trench gate structure. In an embodiment, a semiconductor substrate includes a trench having sidewalls and a bottom, the walls and bottom are covered with a first insulating coating layer which then also includes a conductive gate structure. An embodiment provides the formation of the conductive gate structure with covering at least the sidewalls with a second conductive coating layer of a first conductive material. This results in a conductive central region of a second conductive material having a different resistivity than the first conductive material forming a plurality of conductive bridges between said second conductive coating layer and said conductive central region.

18 Claims, 13 Drawing Sheets

(51) Int. Cl.
*H01L 29/40* (2006.01)
*H01L 29/423* (2006.01)
*H01L 29/49* (2006.01)
*H01L 29/739* (2006.01)
*H01L 29/78* (2006.01)

(52) U.S. Cl.
CPC ...... *H01L 29/4236* (2013.01); *H01L 29/4916* (2013.01); *H01L 29/4925* (2013.01); *H01L 29/66348* (2013.01); *H01L 29/66734* (2013.01); *H01L 29/7397* (2013.01); *H01L 29/7813* (2013.01); *H01L 29/4238* (2013.01); *H01L 29/42368* (2013.01); *H01L 29/4933* (2013.01); *H01L 29/4941* (2013.01)

(58) Field of Classification Search
USPC .................. 257/330, 331, 334, 409, E29.13, 257/E29.131, E29.132
See application file for complete search history.

(56) References Cited

U.S. PATENT DOCUMENTS

| | | |
|---|---|---|
| 6,528,355 B2 | 3/2003 | Hirler |
| 6,580,123 B2 | 6/2003 | Thapar |
| 6,583,673 B2 | 6/2003 | Ahl et al. |
| 7,005,351 B2 | 2/2006 | Henninger et al. |
| 7,045,858 B2 | 5/2006 | Matsuda et al. |
| 7,205,607 B2 | 4/2007 | Alessandria et al. |
| 7,319,256 B1 | 1/2008 | Kraft |
| 7,875,936 B2 | 1/2011 | Magri |
| 8,637,369 B2 | 1/2014 | Magri' et al. |
| 8,664,713 B2 * | 3/2014 | Magri et al. .................. 257/330 |
| 2001/0026989 A1 | 10/2001 | Thapar |
| 2002/0024091 A1 | 2/2002 | Mo |
| 2003/0080428 A1 | 5/2003 | Izumitani et al. |
| 2003/0146470 A1 | 8/2003 | Hijzen |
| 2003/0235958 A1 | 12/2003 | Chan et al. |
| 2006/0273382 A1* | 12/2006 | Hshieh ......................... 257/330 |
| 2007/0063272 A1 | 3/2007 | Arena et al. |
| 2008/0179655 A1 | 7/2008 | Ishida |
| 2010/0163978 A1 | 7/2010 | Magri' et al. |
| 2010/0230747 A1 | 9/2010 | Barletta |

FOREIGN PATENT DOCUMENTS

| | | |
|---|---|---|
| EP | 1659636 | 5/2006 |
| EP | 1742257 | 1/2007 |
| WO | 2004055884 | 7/2004 |

* cited by examiner

INTEGRATED POWER DEVICE ON A SEMICONDUCTOR SUBSTRATE HAVING AN IMPROVED TRENCH GATE STRUCTURE

PRIORITY CLAIM

The present application is a Divisional of copending U.S. patent application Ser. No. 12/645255, filed Dec. 22, 2009, which application claims the benefit of Italian Patent Application Serial No. MI2008A002361, filed Dec. 31, 2008; all of the foregoing applications are incorporated herein by reference in their entireties.

RELATED APPLICATION DATA

The present application is related to the U.S. patent application Ser. No. 13/409411 entitled METHOD FOR MANUFACTURING AN INTEGRATED POWER DEVICE HAVING GATE STRUCTURES WITHIN TRENCHES, filed Mar. 1, 2012, and which is incorporated herein by reference in its entirety.

TECHNICAL FIELD

An embodiment of the present disclosure relates to a method for manufacturing a power device being integrated on a semiconductor substrate.

More specifically, an embodiment of the disclosure relates to a method for manufacturing a power device being integrated on a semiconductor substrate and comprising at least a step of:
making, in said semiconductor substrate, at least a trench having sidewalls and a bottom;
covering the sidewalls and the bottom of such at least one trench with a first insulating coating layer;
making, inside said at least one trench, a conductive gate structure.

An embodiment of the disclosure also relates to a power device being integrated on a semiconductor substrate.

An embodiment of disclosure relates particularly, but not exclusively, to an IGBT (Insulated Gate Bipolar Transistor) device or to a MOS power device and the following description is made with reference to this field of application for convenience of illustration only.

BACKGROUND

As is known in this specific technical field, IGBT power devices and MOS devices are widely and specifically applied in fields with high voltage and current, for example in the field of control circuits and power switches.

These power devices are generally expected to provide good performance at high switching speeds. The typical parameters to reduce switching times in these devices are a low gate charge $Q_g$, and thus a lower gate capacitance, and a reduced and uniform gate resistance $R_g$.

Such good performance is expected even as the sizes of power devices continue to decrease.

IGBT and MOS power devices, being integrated on a semiconductor substrate, comprise a plurality of elementary cells, each having a gate region, interposed to the source and body region.

Elementary cells may be made in two alternative embodiments: one with a planar gate and the other with a trench gate.

In the method for manufacturing a trench-gate power device, and particularly with a trench of the Metal Insulator Semiconductor (MIS) type, for each elementary cell the gate is realized by making a trench, on the semiconductor substrate, whose walls and bottom are covered by a thin oxide layer and then filled in with a polysilicon layer.

These power devices with a trench gate of the MIS type may have several advantages, in particular they may allow the integration scale to be increased, with a subsequent increase in the current density and a JFET resistance drop as well, considerably improving the device conductance.

Nevertheless, power devices with a trench gate of the MIS type may have some drawbacks. In fact, the trench bottom type may cause a thickening of the electric field with a subsequent worsening, for the same drift-layer thickness, of the break-down voltage of the device. A solution to this drawback is to make the trench bottom with a "U" shape, which may allow the breakdown voltage to be improved.

Nevertheless, these trench-gate devices may have another drawback if compared with a planar-gate device, for each elementary cell there is an increase in the area being occupied by the gate oxide in correspondence with the trench, involving an increase in parasitic capacitances linked to the gate terminal of the device.

A known solution to solve these drawbacks is described, for example, in U.S. Pat. No. 7,205,607, which is incorporated by reference. As shown in FIG. 1, this solution provides the reduction in the overlapping area between the trench gate oxide and the gate electrode by limiting in particular the gate electrode extension only to trench vertical walls. In this way, a reduction in gate-drain capacitance, and consequently, in gate charge, may be obtained.

Another known solution is described in US Patent Application No. 2007/0063272, which is incorporated by reference, as shown in FIG. 2. This solution provides an oxide thickening in the trench bottom and in the walls below the body region. Moreover, in correspondence with the thick oxide, there is a conductive layer being independent from the gate electrode and electrically insulated therefrom. According to this solution, the thin gate electrode is present only in the trench sidewalls, thus allowing a reduction in the gate-drain capacitances and thus also in the gate charge to be obtained.

A similar solution is also described in U.S. Pat. No. 7,005,351, which is incorporated by reference and which corresponds to a method for manufacturing a transistor configuration comprising at least a trench transistor cell, shown in FIG. 3. This solution too provides a thick oxide in the trench bottom and a thin gate oxide only in the trench sidewalls.

Further known solutions are shown in the following four documents per FIGS. 4-7, respectively, of the present application: U.S. Pat. No. 6,528,355; US Patent Application No. 2003/0235958; US Patent Application No. 2001/0026989; European Patent Application No. EP1742257 all of which are incorporated by reference.

The solutions being indicated in these four documents generally provide a thickening of the gate oxide in the trench bottom with a single conductive layer making the gate electrode. A thin gate oxide is present, on the contrary, in the trench walls, near the body regions, allowing a reduction in the gate-drain capacitances and thus also in the gate charge to be obtained.

Moreover, referring to FIG. 8, the solution being described in the U.S. Pat. No. 7,045,858, which is incorporated by reference, provides the presence of a metal silicide layer on trench walls contacting the polysilicon so as to reduce the gate electrode resistance, thus improving the switching rate.

It is noted that in general in these power devices the signal transmission line or conductive mesh is implemented by means of the same gate electrode.

SUMMARY

Although answering to the aim and being satisfactory in several applications, known solutions are not free from drawbacks. In particular, the switching control during the operation of these known power devices may be unsuitable because the gate resistance and the gate charge are too high.

An embodiment of the present disclosure is a method for manufacturing a power device having such structural and functional features as to improve performance, and overcome the limitations and/or drawbacks still limiting devices being manufactured according to the prior art.

An embodiment of the present disclosure is to make for each trench a gate structure, which may be electrically controlled.

An embodiment of a method for manufacturing a power device being integrated on a semiconductor substrate comprises at least a step of:
  making, in said semiconductor substrate, at least a trench having sidewalls and a bottom;
  covering the sidewalls and the bottom of said at least one trench with a first insulating material coating layer;
  making, inside said at least one trench, a conductive gate structure;
  wherein said step of making said gate structure comprises the steps of:
  covering at least the sidewalls with a second coating layer of a first conductive material; and
  making a conductive central region of a second conductive material having a different resistivity than said first conductive material;
  making a plurality of conductive bridges between said second conductive coating layer and said conductive central region.

According to an embodiment of the present disclosure a power device has such a trench gate structure so as to make a gate electrode and a signal transmission line or conductive mesh being separated from each other and intercoupled by means of preselected conductive bridges.

According to an embodiment of the disclosure the second conductive material is made with a same material having a different resistivity or, alternatively, with a different material than the first conductive material being able to optimize the conductive-gate-structure performance so as to meet specific design requirements.

The plurality of conductive bridges may be made by a step of making along the sidewalls of said at least one trench, interposed between the second conductive coating layer and the conductive central region, a plurality of contact areas spaced out by insulating elements or spacers, and the step of filling in the plurality of contact areas with the second conductive material to make conductive bridges.

Each contact area may have a different width than the width of each insulating element (spacer) so as to adjust a gate resistance value of the corresponding gate structure.

The step of making a conductive central region may be preceded by the step of making in correspondence with the bottom of said at least one trench and over said semiconductor substrate, at the side of said at least one trench, a portion and upper portions of a thick oxide layer respectively.

An embodiment may include a step of making board circuitry of the power device and a step of making an intermediate dielectric layer on the semiconductor substrate as well as providing further metallization and masking steps in order to realize source terminals and gate terminals and corresponding source-body contacts and gate contacts.

An embodiment of the power device may be integrated on a semiconductor substrate and comprise:
  at least one trench being made in the semiconductor substrate and having sidewalls and a bottom;
  a first insulating material coating layer extending along the sidewalls and bottom of said at least one trench;
  a conductive gate structure being made inside said at least one trench;
  wherein said conductive gate structure comprises a second conductive coating layer of a first conductive material extending along the sidewalls of said at least one trench and a conductive central region of a second conductive material being intercoupled to said second coating layer by means of a plurality of conductive bridges, the second conductive material having a different resistivity than said first conductive material.

According to an embodiment of the present disclosure, the power device has such a trench gate structure as to allow a gate electrode and a signal transmission line or conductive mesh to be made, being separated from each other and intercoupled by means of preselected conductive bridges.

It may be possible to optimize the conductive-gate-structure performance by arranging the second conductive material having a different resistivity or a different material than the first conductive material, so as to have electrical features according to specific design requirements.

An embodiment of the device may comprise along the sidewalls of said at least one trench and interposed between the second conductive coating layer and the conductive central region, a plurality of contact areas spaced out by insulating elements (spacer), the plurality of contact areas being filled in with the second conductive material to make conductive bridges.

Each contact area of the plurality of contact areas may have a different width than the width of each of said insulating elements or spacers so as to adjust a gate resistance value of the gate structure.

An embodiment of the power device may have in correspondence with the bottom of said at least one trench and over the semiconductor substrate, at the side of said at least one trench, a lower portion and upper portions of a thick oxide layer respectively.

An embodiment of the device may comprise board circuitry and an intermediate dielectric layer positioned over the semiconductor substrate as well as source terminals and gate terminals and corresponding source-body contacts and gate contacts.

BRIEF DESCRIPTION OF THE DRAWINGS

Features and advantages of a method and device according to one or more embodiments of the disclosure will be apparent from the following description given by way of non limiting example with reference to the annexed drawings.

In the drawings.

DETAILED DESCRIPTION

With reference to the drawings, an embodiment of a method for manufacturing a power device 1 being integrated on a semiconductor substrate 2 is described.

The process steps and structures being described hereafter may not make a complete process flow for manufacturing integrated devices.

The drawings representing cross sections of portions of an integrated device during manufacturing may not be drawn to scale, but they are drawn in order to explain features of one or more embodiments.

An embodiment of the present disclosure may be implemented together with the techniques for manufacturing integrated device is being presently used in the field and only those commonly-used process steps being necessary for understanding the present disclosure may be included.

Figure 1:
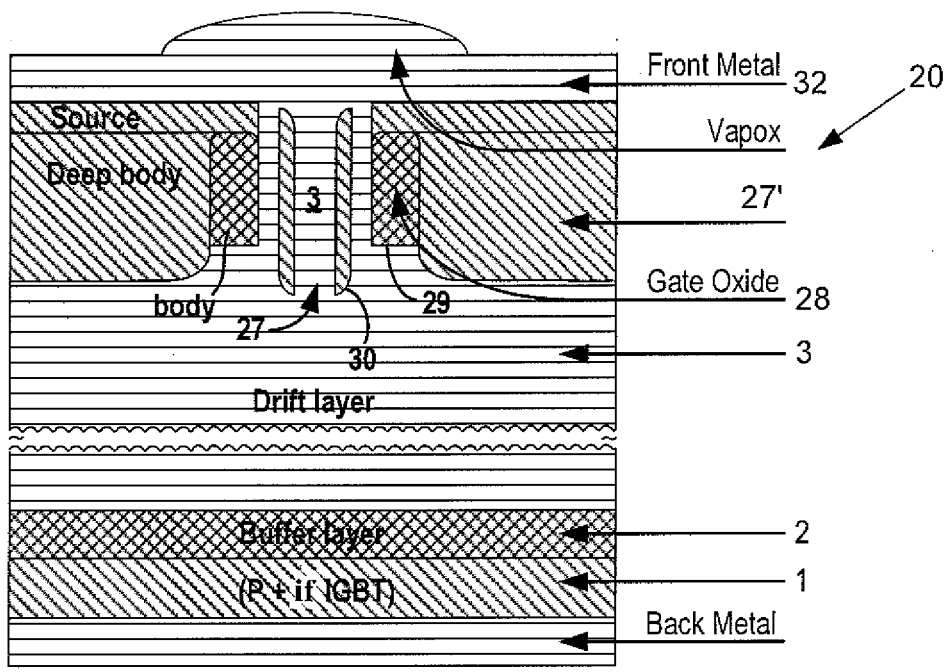
FIGS. 1 to 8 show trench-gate power devices being made according to the prior art.
Figure 2:
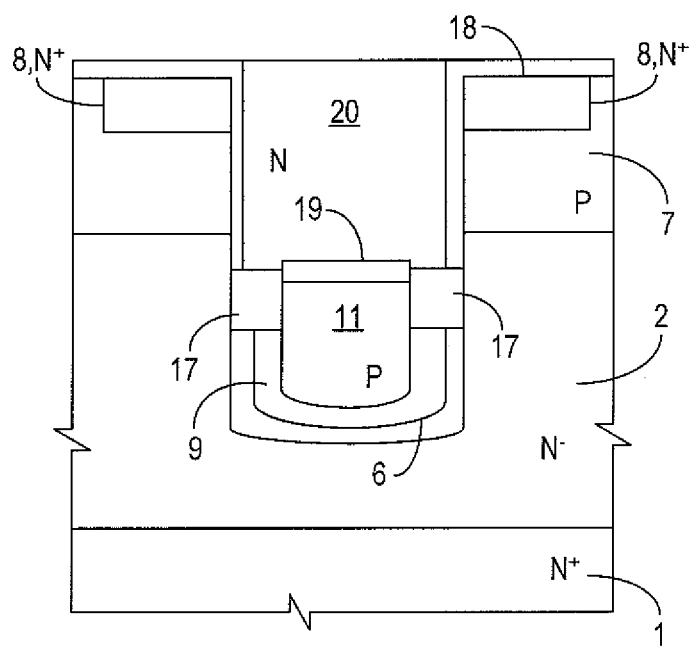
Figure 3:
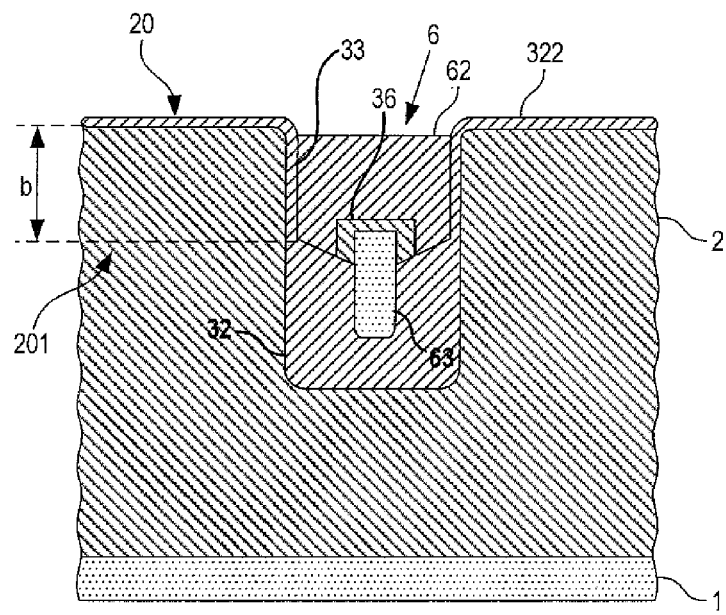
Figure 4:
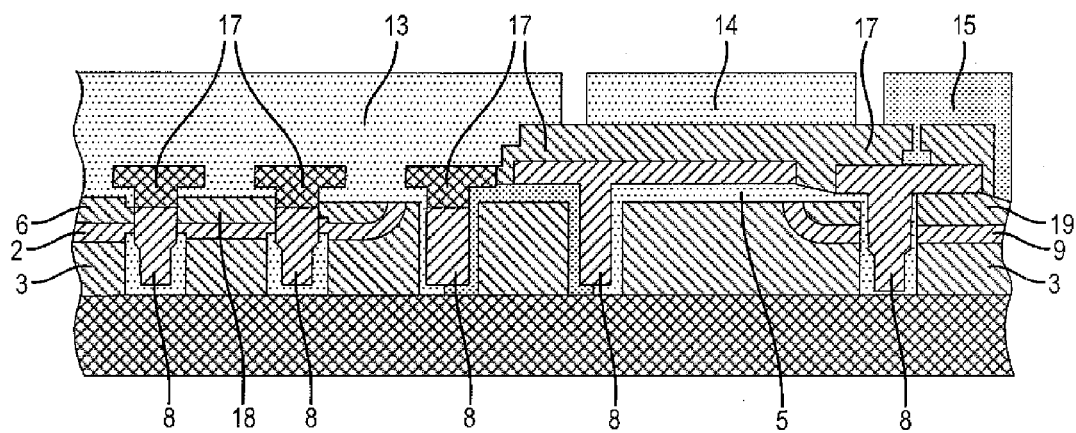
Figure 5:
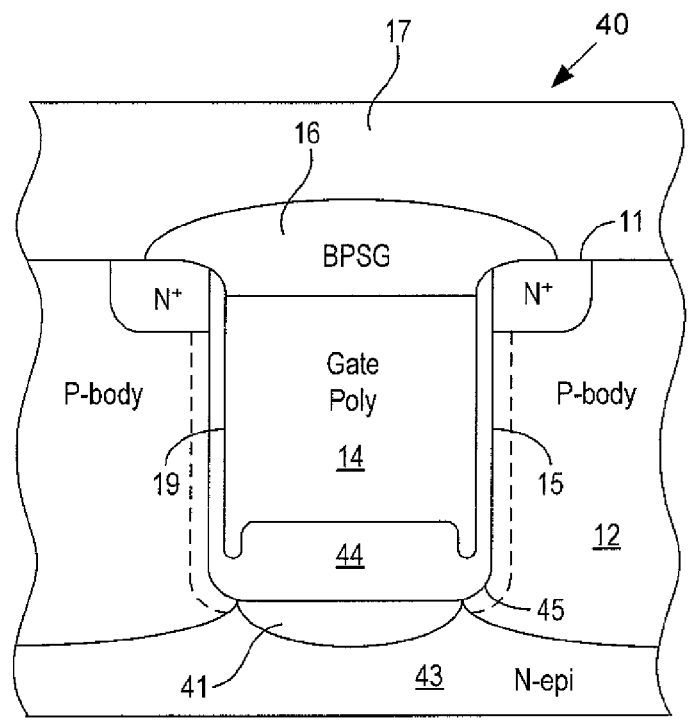
Figure 6:
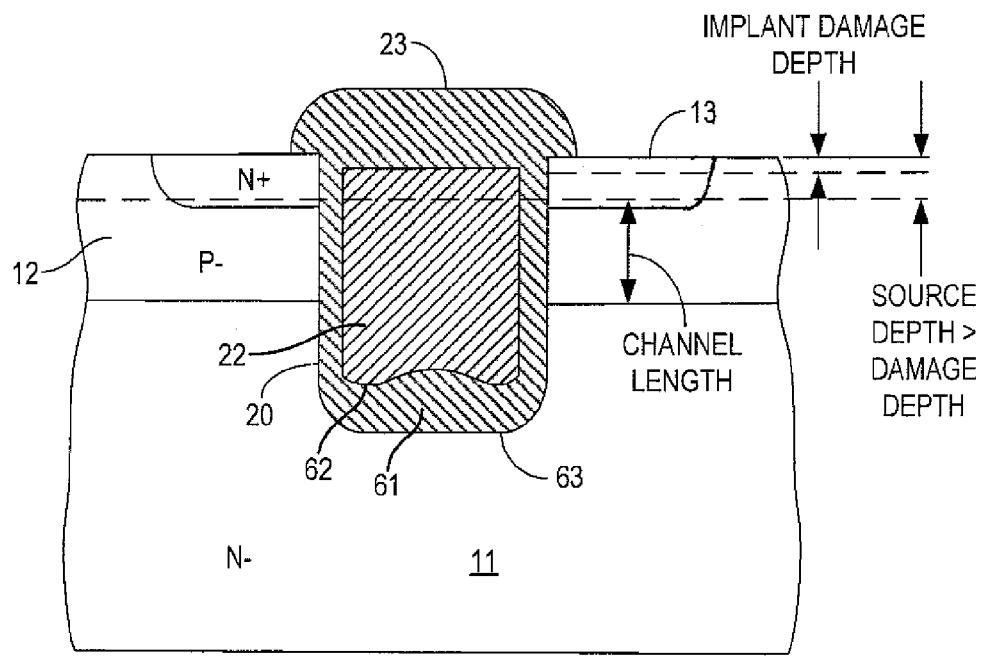
Figure 7:
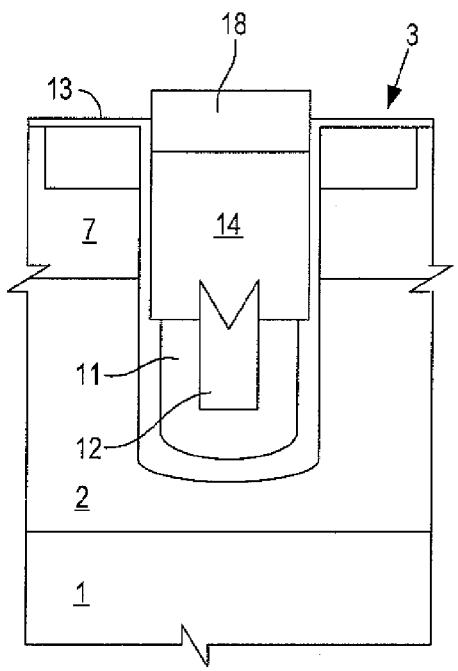
Figure 8:
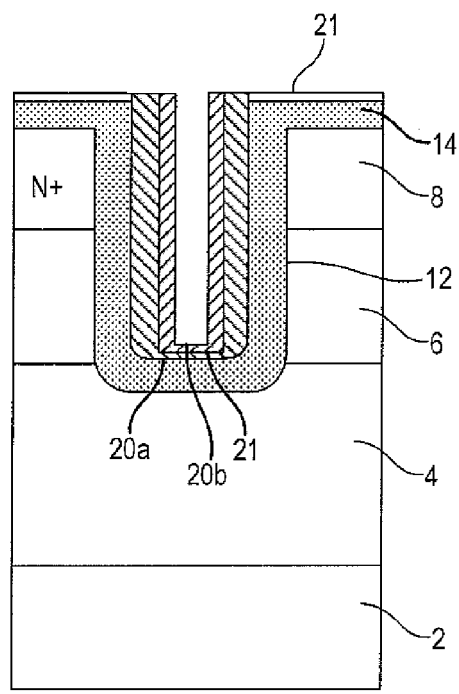
Figure 9:
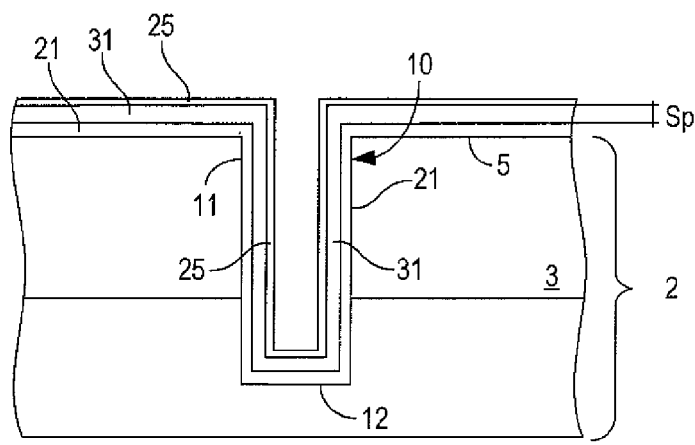
FIGS. 9-11 show, in a vertical sectional view, a device portion, in several steps of a method according to an embodiment of the present disclosure.

With reference to FIG. 9, an embodiment of the method includes the steps of:

providing a starting substrate of the N+ or P+ type according to the device to be manufactured and epitaxially growing, on the starting substrate, a silicon layer of a resistivity and a thickness predetermined with relation to a tension class (drift layer), for example with a resistivity of 0.5 Ωcm and a thickness of 10 μm, to make a semiconductor substrate 2 having an upper surface 5.

Figure 12:
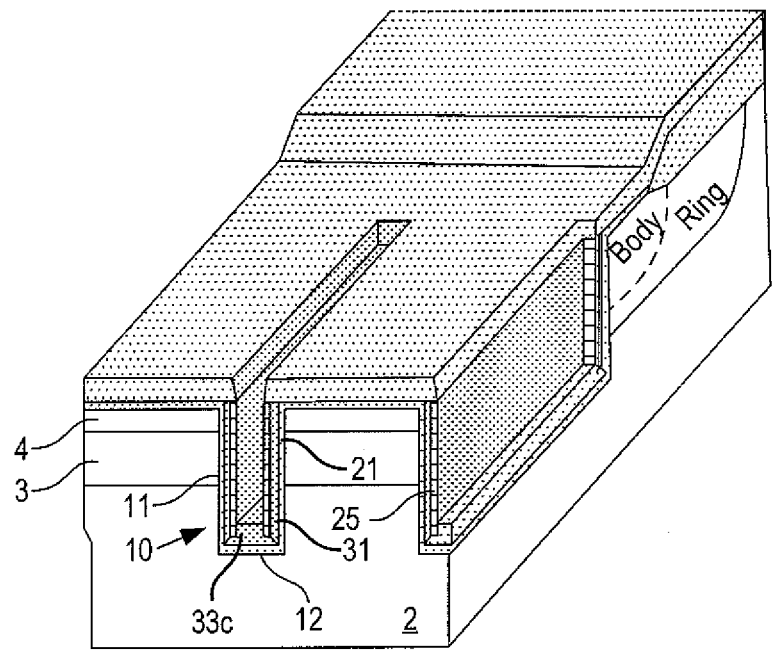
FIGS. 12-15 show in a partially-sectional perspective view a device portion in some steps of a method according to an embodiment of the present disclosure.

Afterwards, a body structure 3 is made, for example by means of an ion-implantation of the open-air type, in the semiconductor substrate 2. Moreover, according to the type of power device to be manufactured, source regions 4 (FIG. 12) are made on the body structure 3.

Then an embodiment of the method includes the steps of:
making, in the semiconductor substrate 2, at least a trench 10 having sidewalls 11 and a bottom 12.

In the following description reference will be made to a trench, although this expression means at least one trench.

Conveniently, the trench 10 may have a higher depth than the body structure 3 partially occupying the underlying semiconductor substrate 2.

The trench 10 may be for example, through a photolithographic etching step of the upper surface 5 of the semiconductor substrate 2 by using an appropriate mask (e.g., a hard mask).

Afterwards, a cleaning step of the sidewalls 11 of the trench 10 may be performed, as well as a removal step of the mask.

An embodiment of the method then includes:
covering the sidewalls 11 and the bottom 12 of the trench 10 with a first insulating coating layer 21, for example an oxide, to define a gate dielectric. This first insulating coating layer 21 also covers the upper surface 5 of the substrate 2 between one trench 10 and another adjacent trench 10 (adjacent trench not shown in FIG. 9).

An embodiment of the method then includes a step of making, inside the trench 10, a conductive gate structure 30.

In an embodiment, this step includes:
covering at least the sidewalls 11 of the trench 10 with a second conductive coating layer 31. This covering step may be made by depositing, on the first insulating coating layer 21, a first conductive material layer, for example polysilicon, having a starting thickness $s_p$ comprised between approximately 50 nm and 500 nm. According to an embodiment, the second conductive coating layer 31 makes a gate electrode for each elementary cell of the power device 1.

In an embodiment, the second conductive coating layer 31 is deposited to also cover the bottom 12 of the trench 10 and the upper surface 5.

An embodiment of the method then includes the step of making an insulating layer 25 to cover the second conductive coating layer 31, in correspondence with the sidewalls 11 and bottom 12 of the trench 10, and eventually the upper surface 5 as well.

In particular, the insulating layer 25 may inhibit the possible oxidation of the silicon included in the second conductive coating layer 31. By way of example, the insulating layer 25 may have a thickness comprised between approximately 10 nm and 150 nm and it may be made by means of a nitride layer, or an oxinitride layer, or being made as a multilayer formed by an oxide layer and a nitride layer or an ONO layer, i.e. an oxide layer, a nitride layer and an oxide layer, the choice depending on design requirements.

Figure 10:
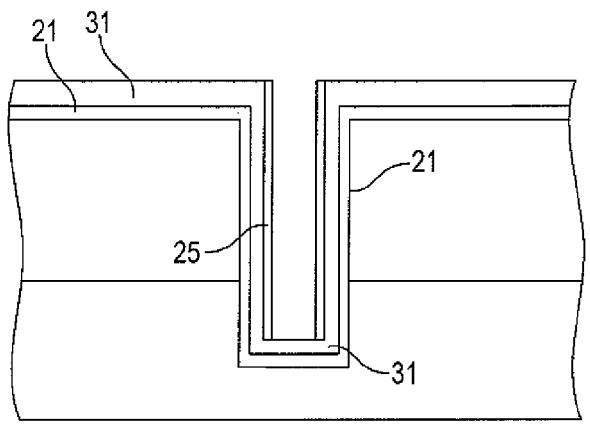

Next, an embodiment of the method includes a step of:
etching, selectively in an anisotropic way, the insulating layer 25 to remove it from the upper surface 5 of the semiconductor substrate 2 and from the bottom 12 of the trench 10, in order to expose the second underlying conductive layer 31, as shown in FIG. 10.

Figure 11:
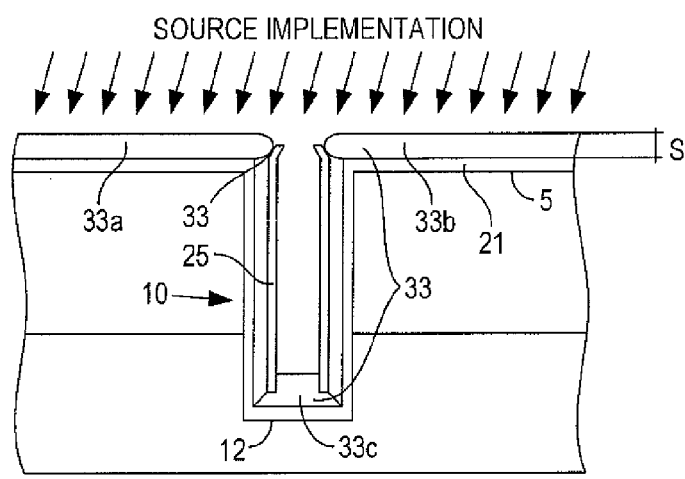

With reference to FIG. 11, an embodiment of the method then includes an oxidation step of the second exposed conductive coating layer 31, i.e. lying on the bottom 12 of the trench 10 and on the upper surface 5 of the semiconductor substrate 2, making respective and corresponding lower portion 33c and upper portions 33a and 33b of a thick oxide layer 33 LOCOS. The thick oxide layer 33 LOCOS may have, in each portion, at the end of the oxidation step, a final thickness S according to the relation $S > 2*s_p$, where $s_p$ is the starting thickness of the second conductive coating layer 31.

Then, according to an embodiment of the present disclosure, the second conductive coating layer 31 along the sidewalls 11 of the trench 10, does not undergo the oxidation step, since it is covered by the insulating layer 25, and it maintains thus the starting thickness $s_p$.

Alternatively to the previous description, source regions 4 may be made after the oxidation step, through an ion-implantation step. Naturally, in this case the implantation may be performed with such energy as to overcome the thickness of the thick oxide layer 33 LOCOS.

After the oxidation step, an embodiment of the method may include a doping step of the second conductive coating layer 31. In particular, with reference to FIG. 11, the doping step may be performed through an implantation process with such an angle ±α in order to allow the sidewalls 11 of the trench 10 to be suitably exposed on both sides.

Figure 13:
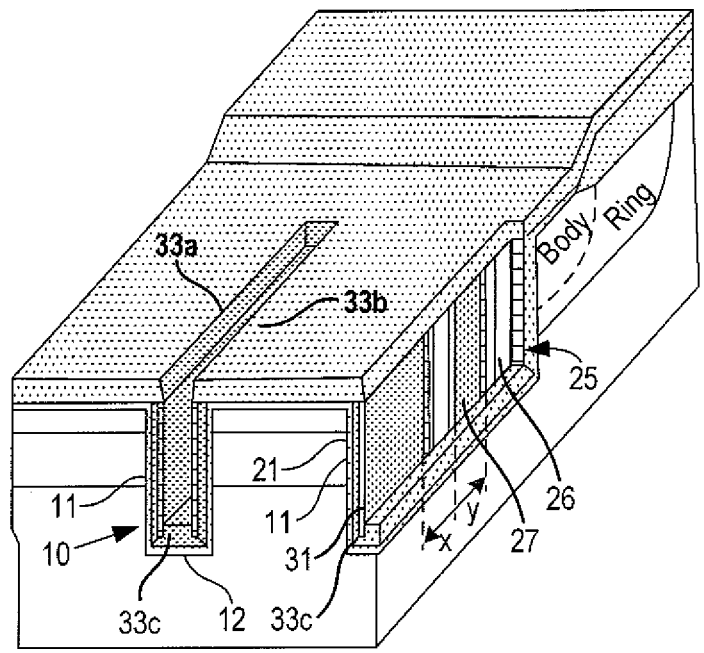
Figure 14:
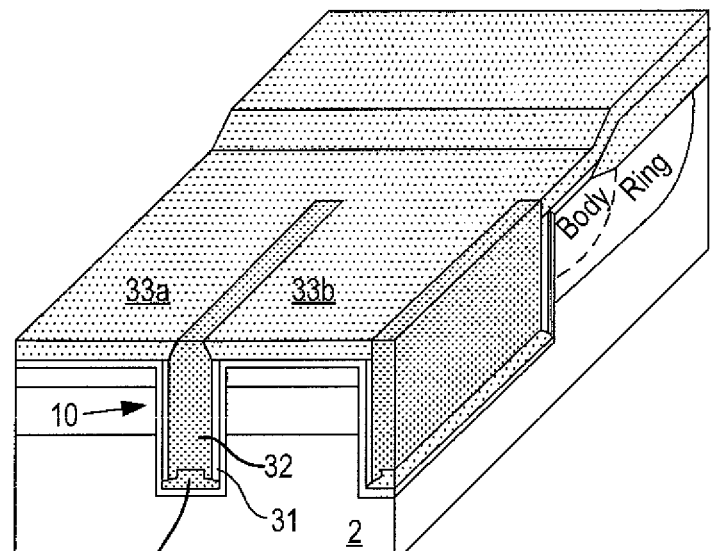

With reference to FIG. 13, according to an embodiment, to provide an isotropic etching of the insulating layer 25 via a mask in order to make, along the sidewalls 11 of the trench 10, a plurality of openings or contact areas 27, with an appropriate width y, being spaced apart by insulating elements 26 or spacers, with an appropriate width x. The plurality of contact areas 27 allows portions corresponding to the second underlying conductive coating layer 31 to be exposed.

Moreover, according to an embodiment of the present disclosure, the ratio between the width y of each contact area 27 and the width x of each insulating element or spacer 26 may be variable for each elementary cell in order to be able to adjust a gate resistance $R_g$ value of the gate structure of each elementary MOS transistor made in the power device 1.

A method according to an embodiment of the present disclosure may then include:
completely filling in each trench 10 with a second conductive material in order to make a conductive central region 32 to complete the gate structure 30. In particular, the second conductive material may also fills in the plurality of contact areas 27 making a plurality of conductive bridges 28, which define a conductive connection between the conductive central region 32 of the trench 10 and the second conductive coating layer 31.

This second conductive material may be formed with a different resistivity than the first conductive material forming the second conductive coating layer 31. This second conductive material may be made, for example, from a doped polysilicon layer or from a metal (like W or Al etc.).

Thus, according to an embodiment of the present disclosure, the conductive gate structure 30 may be made by two separate conductive parts: a first part made by the second conductive coating layer 31, defining the gate electrode for each elementary MOS transistor, and a second part made by the conductive central region 32 of the trench 10 defining a portion of a conductive mesh. The conductive mesh portion weaves inside the power device 1 conveniently carrying a signal to a plurality of elementary MOS transistors.

In particular, according to an embodiment of the present disclosure, it may be possible to make the gate electrode and the conductive mesh with two different materials, or at least with a different resistivity, thus potentially optimizing each part of the gate structure 30 according to specific design requirements.

The separation between the second conductive coating layer 31 and the conductive central region 32, as well as the possibility of selectively positioning the plurality of conductive bridges 28 therebetween, allows the gate resistance of each elementary MOS transistor to be predetermined, thus allowing a local control of the gate resistance $R_g$ and thus a switching control of the conducting power device 1.

Moreover, the conductive mesh, i.e. the conductive central portion 32 of the trench 10, may be made at such a distance from the gate dielectric, i.e. from the first coating layer 21, as to allow an appropriate doping, or in any case made with any low-resistivity material, which may be integrated in a manufacturing process without invalidating the power device 1 functionality.

For example, in the case of a power device 1 of the P-channel type, the gate electrode may be doped with boron at the lowest concentration in order to make it thus of the degenerate type and also not to alter the gate dielectric quality, while the conductive mesh, i.e. the conductive central region 32, may be made with a N-type hyperdoped polysilicon. In this case, a metallic barrier may be made between such two conductive materials, in order to avoid a junction.

The bottom 12 of the trench 10 may be made with a high thickness defined by the lower portion 33c of the thick oxide layer 33 LOCOS and by the first underlying coating layer 21, and this may allow the gate-drain capacitance and thus also the gate charge $Q_g$, to be reduced.

An embodiment may then include the following standard steps for completing the power device 1. In particular, a step of making termination contacts, for example, by etching back the conductive central region 32, by using a mask. A following and possible silicidization step of the second conductive material, in case it is a polysilicon layer, to make on the conductive central region 32 a silicidized portion 39, which is interposed between the upper portions 33a and 33b of the thick oxide layer 33 LOCOS.

Figure 15:
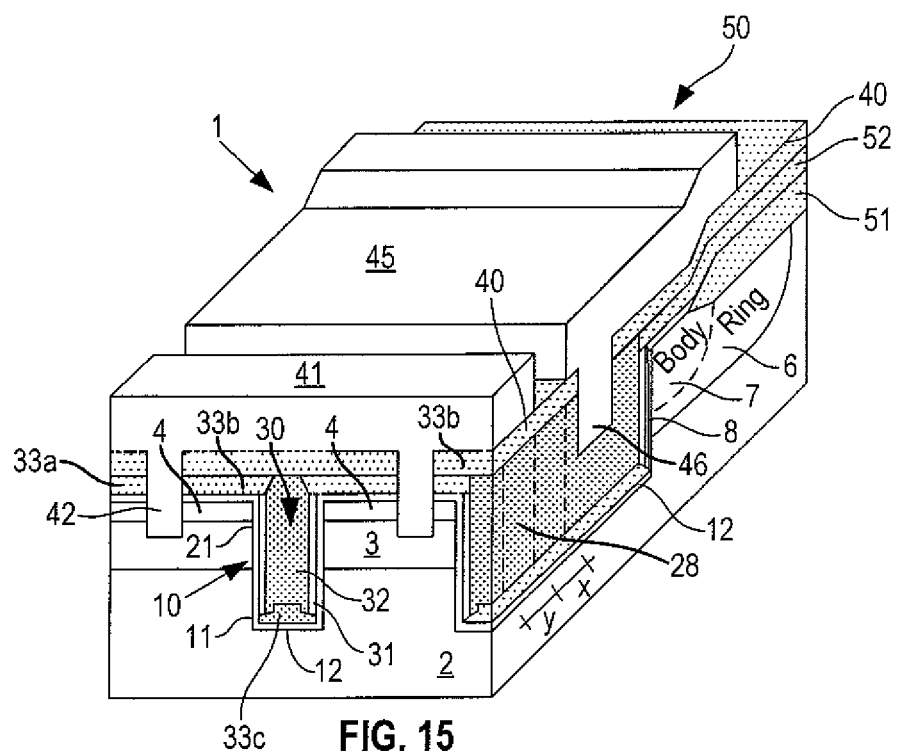

Finally, according to a standard procedure, with reference to FIG. 15, an embodiment may include the step of making an intermediate dielectric layer 40, for example by depositing a masked silicon oxide layer, as well as following metallization steps to make, on the intermediate dielectric layer 40, a metallization layer suitable to define a source terminal 41 and a gate terminal 45.

The source terminal 41 may have appropriate source-body contacts 42, being made conventionally, while the gate terminal 45 may have appropriate gate contacts 46 in correspondence with the conductive central portion 32 of each trench 10.

Several alternative embodiments are contemplated.

In the following description reference will be made to the above-described embodiments and particular steps and cooperating parts having the same structure and function will be indicated with the same numbers and reference marks.

Figure 17:
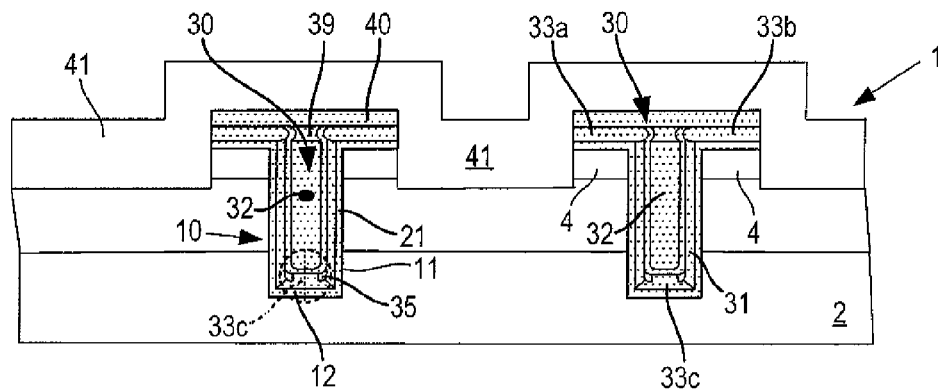

With reference to FIG. 17, and according to an alternative embodiment, the etching step of the insulating layer 25 may be divided in two steps. In particular, a first selective etching step of the insulating layer 25 removing this layer in correspondence with the bottom 12 and on the upper surface 5 to expose the second underlying conductive coating layer 31.

Afterwards, an oxidation step of the second exposed conductive coating layer 31 making respective and corresponding upper 33a, 33b and lower 33c portions of the thick oxide layer 33 LOCOS.

An embodiment then includes a second selective etching step of the insulating layer 25 to make along the sidewalls 11 of the trench 10 a plurality of openings or contact areas 27, with an appropriate width y, being spaced apart by insulating elements or spacers 26, with an appropriate width x. The plurality of contact areas 27 may allow portions corresponding to the second underlying conductive coating layer 31 to be exposed.

Moreover, an embodiment may include, before said oxidation step of the second conductive coating layer 31, a cleaning step being performed, for example, through a growing step of a sacrificial oxide layer on the second conductive coating layer 31 in order to close possible gaps or cavities on this layer surface and being generated by the previous first etching of the insulating layer 25.

Afterwards, a removal step of the sacrificial oxide layer being grown may be performed, by using an appropriate mask in order to leave further insulation areas in correspondence with the contact areas 27 being made with the possibility to change, if necessary, the gate resistance value for each elementary MOS transistor.

Figure 16:
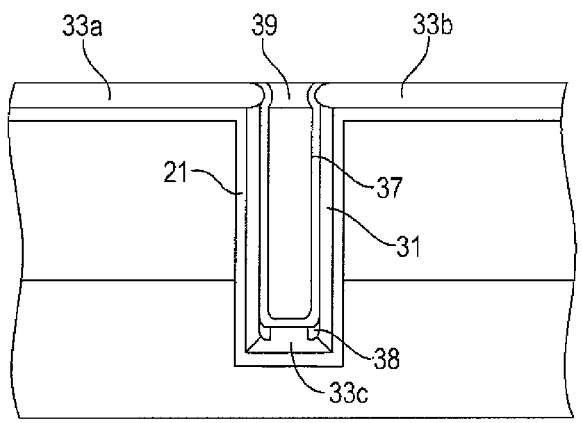
FIGS. 16-17 show in a vertical sectional view a device according to a another embodiment of the present disclosure.

Moreover, with reference to FIG. 16, after the oxidation step of the second conductive coating layer 31, an embodiment may perform a step of making an interface layer 37, which may be present on the whole semiconductor substrate 2 or positioned in correspondence with the sidewalls 11 and bottom 12 of each trench 10. This interface layer 37 may be alternatively a thin metal layer, for example of Ti, W, Pt, Co, or silicide for example TiTiN, TiTiONTi, CoSi2, PtSi or the like.

Where the interface layer 37 is present on the whole semiconductor substrate 2, an embodiment includes after the step of making termination contacts, an etching step of the interface layer 37 in correspondence with the upper surface 5 of the semiconductor substrate 2.

According to an embodiment, each trench 10 has a sacrificial oxide strip 38 extending along each sidewall 11 in correspondence with the bottom 12 and near the lower portion 33c of the thick oxide layer 33 LOCOS and in contact with the second conductive coating layer 31.

Thus, an embodiment may continue with appropriate conventional steps according to the previous description.

Figure 20:
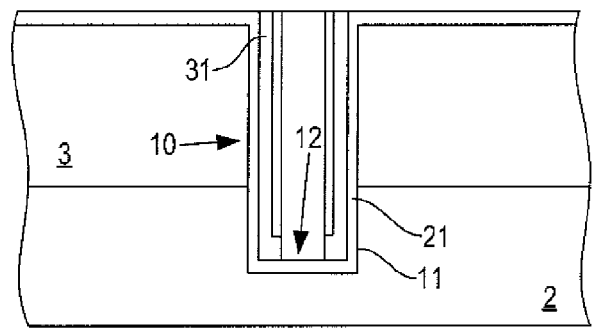
FIGS. 20-22 show in a vertical sectional view a portion of a device in several steps of a method according to an embodiment of the present disclosure.
Figure 21:
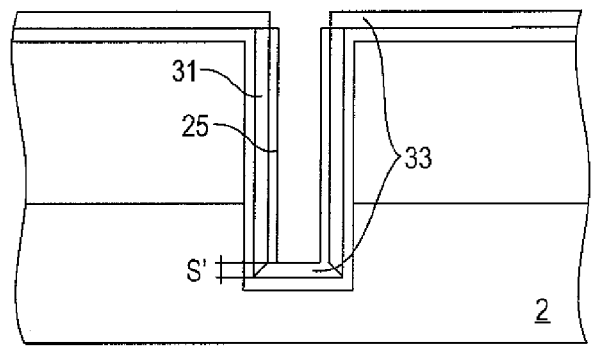
Figure 22:
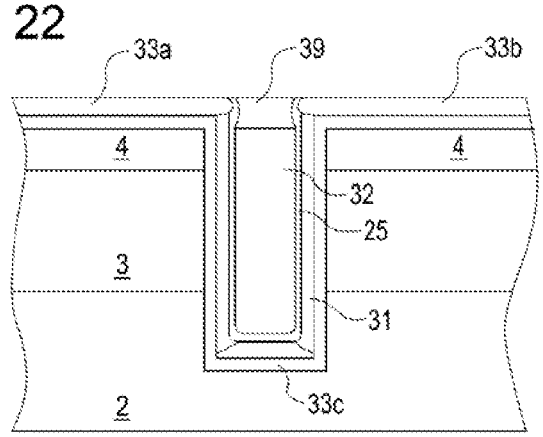
Figure 23:
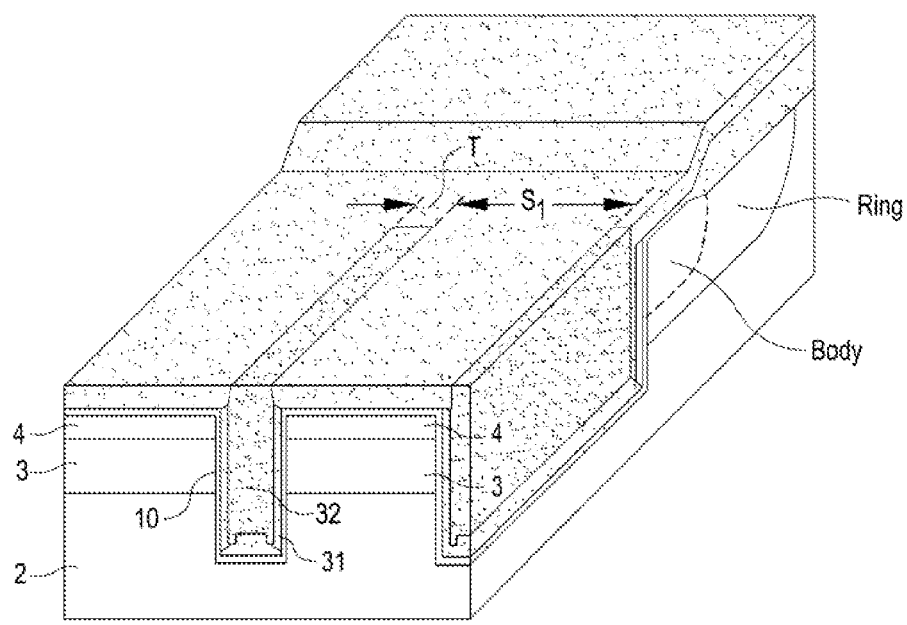
FIG. 23 shows a portion of a device being made according to an embodiment of the present disclosure in an intermediate manufacturing step.

With reference to FIGS. 20-22, according to another embodiment, a method includes, in a manner similar to the previous description, the formation of a trench 10 with a first insulating coating layer 21 to define a gate dielectric, the covering of the sidewalls 11 and bottom 12 with a second conductive coating layer 31 and with an insulating layer 25.

An embodiment continues, differently from the above-described embodiment, with a first selective and anisotropic etching step of the insulating layer 25 and of the second conductive coating layer 31. In this way, the second conductive coating layer 31 is removed in correspondence with both the upper surface 5 of the semiconductor substrate 2 and the trench bottom 12.

Afterwards, an embodiment includes a step of making on the upper surface 5 and on the bottom 12 of the trench 10 appropriate and corresponding portions 33a, 33b and 33c of a thick oxide layer 33 LOCOS. According to an embodiment, portions 33a, 33b and 33c of the thick oxide layer 33 LOCOS may have a variable thickness S' according to the design requirements of the power device 1 to be manufactured. Moreover, this thick oxide layer 33 LOCOS is, in other words, "virgin", i.e. it is substantially devoid of any contamination deriving from previous steps and thus, being substantially devoid of any transformation, it may allow a considerable improvement in the efficiency of the power device to be manufactured.

Afterwards, an embodiment includes a second selective etching step of the insulating layer 25 along the sidewalls 11 of the trench 10 to make a plurality of contact areas 27, with an appropriate width y, being spaced apart by insulating elements or spacers 26, with an appropriate width x, according to the above-described process steps.

In particular, an embodiment continues by making a conductive central region 32 with a second conductive material having a different resistivity than the first conductive material. This second conductive material may also fill in the plurality of contact areas 27 making a plurality of conductive bridges 28, which, define a conductive connection between the conductive central region 32 of the trench 10 and the second conductive coating layer 31.

Following standard steps to make appropriate source terminals, gate terminals and drain terminals as well thus complete the power device 1.

Figure 24:
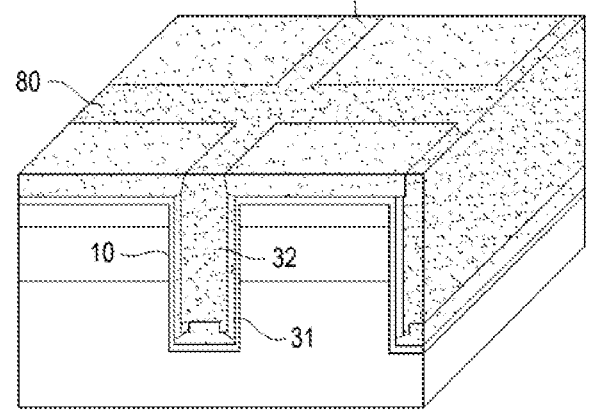
FIG. 24 shows a portion of a device being made according to an embodiment of the present disclosure in an intermediate manufacturing step.

With reference to FIG. 24, an embodiment also allows a conductive buried strip 80 to be made, being arranged crosswise to each trench 10 and included in the upper portions 33a and 33b of the thick oxide layer 33. An embodiment provides the formation of the buried strip 80 by using the second conductive material as well as made in such a way as to contact only the conductive central region 32 of each trench 10. This buried strip 80 defines a gate bus for the power device 1.

An embodiment also allows onboard circuitry 50 of the power device 1 to be made in correspondence with a circuitry area on the margin of an area being dedicated to the formation of elementary MOS transistor cells.

According to an embodiment, with reference to FIG. 15, the board circuitry 50 is made by making in the semiconductor substrate 2 a body region 7 included in a ring region 6, as well as by making on the upper surface 5 an appropriate sequence of a first circuitry layer 51 and of a second circuitry layer 52. The second circuitry layer 52 is overlapped in turn by the intermediate dielectric layer 40.

In an embodiment, the gate terminal 45 overlaps the intermediate dielectric layer 40 and, as previously described, appropriate gate contacts 46 are made to contact the conductive central region 32 of each trench 10.

Figure 18:
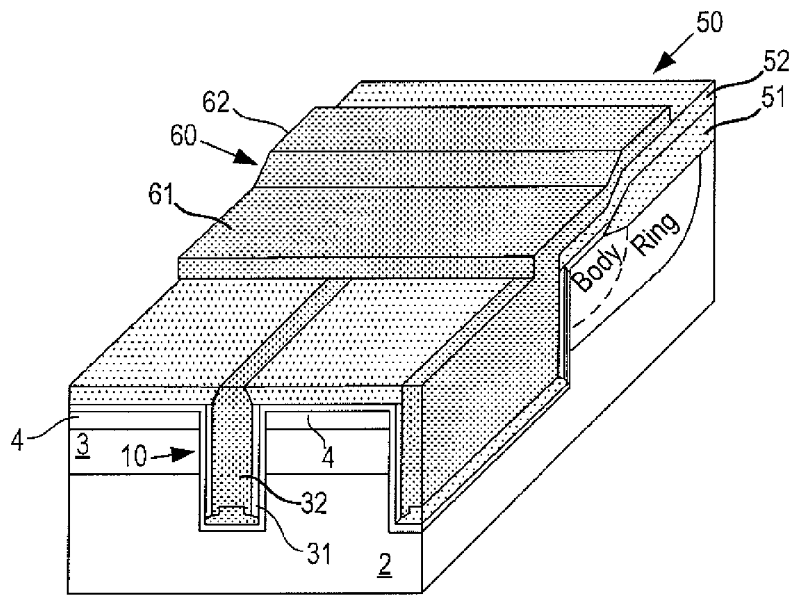
FIGS. 18-19 show in a partially-sectional perspective view a portion of a device being made according to an embodiment of the present disclosure.
Figure 19:
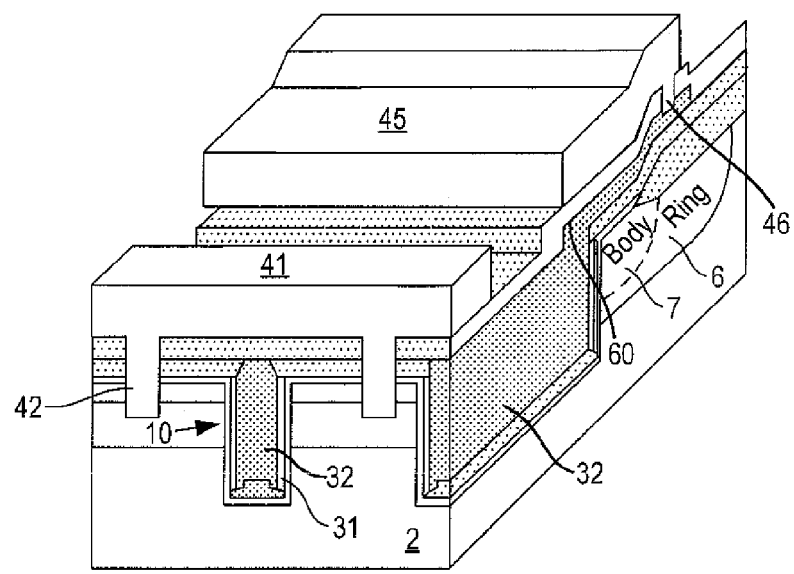

According to an embodiment, shown in FIGS. 18 and 19, a conductive connection layer 60 is formed overlapping said two-circuitry layers 51 and 52 composing onboard circuitry 50.

In particular, the connection layer 60 may be made with a step profile and defined by:
a first portion 61, being made on the upper portions 33a and 33b, of the thick oxide layer 33 LOCOS and in contact with the conductive central region 32 of the trench 10, of each elementary MOS transistor;
a second portion 62 overlapping said two circuitry layers 51 and 52.

The connection layer 60 may be formed with the second conductive material making the conductive central region 32 and, as shown in FIG. 19, is overlapped by the intermediate dielectric layer 40 and by the gate terminal 45. According to an embodiment, the gate terminal 45 has gate contacts 46 being made so as to contact the connection layer 60 of the onboard circuitry 50.

According to an embodiment, end portions 71 of each trench 10 to be made, in correspondence with the onboard circuitry 50, in order to meet specific layout requirements.

Figure 26:
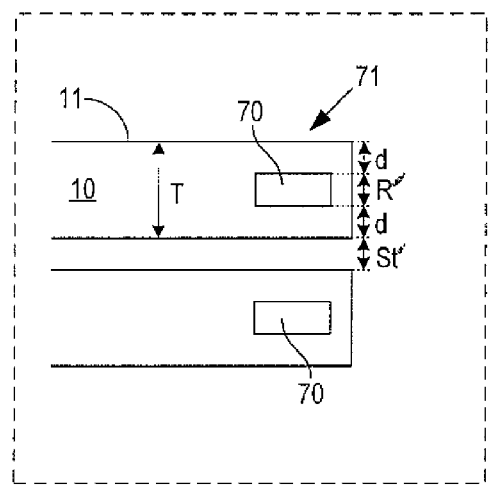
FIGS. 26-31 show, in a plan view, different embodiments of a trench.

In particular, as shown in FIG. 26, which is a plan view of an embodiment of the power device 1, the conductive central region 32 of the trench 10 of each elementary MOS transistor is made with a surface width T at an interval St from the adjacent conductive central region 32 of the adjacent trench 10.

An embodiment includes the formation, inside the end portion 71, of a gate contact 70 being made by means of a pad with a width R at a distance d from both sidewalls 11 of the trench 10, with a length varying according to need. The gate contact 70 contacts in each trench 10 the conductive mesh, i.e. the conductive central region 32.

Figure 27:
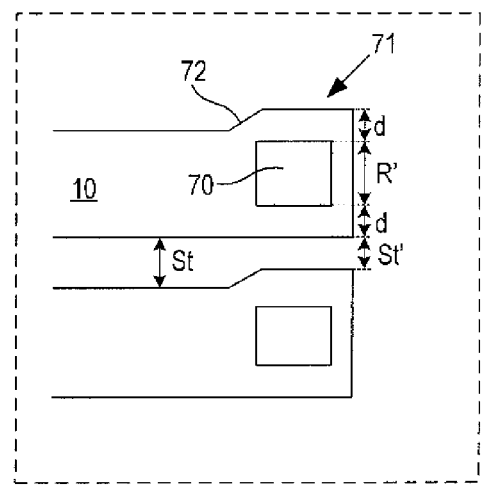

According to an embodiment, shown in FIG. 27, each trench 10 is made with a side extension 72 of a sidewall 11 of the trench 10, in correspondence with the end portion 71, in order to be able to make a gate contact 70 with a larger surface width R' than the width R of the embodiment shown in FIG. 26 and at a substantially same distance d from both sidewalls 11 of the trench 10. But the distance $S_t'$ between trenches 10, in correspondence with the end portion 71, may be lower than the distance S$_t$ of the embodiment shown in FIG. 26.

Figure 28:
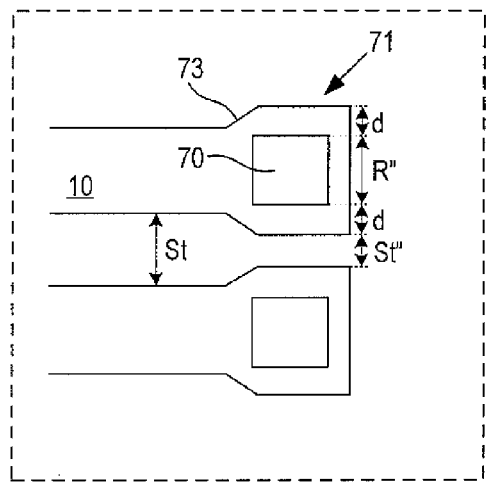

In an embodiment, shown in FIG. 28, forms an end portion 71 of the trench 10 has a bottle-neck extension 73, being made by means of a same extension 72 for each sidewall 11. In this way, a gate contact 70 may have a larger surface width R" than the surface width R' of the embodiment shown in FIG. 27 and a corresponding reduction in the distance S$_t$" between trenches 10 with respect to the corresponding distance S$_t$' of the previous embodiment.

Figure 29:
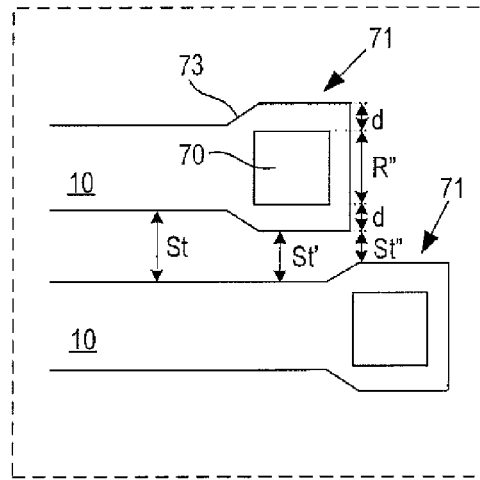

In embodiment shown in FIG. 29, trenches 10 are formed with end portions 71 being misaligned with each other. The end portion 71 may have any of the above-described shapes. In particular, FIG. 29 shows end portions 71 being made with a bottle-neck 73, such that with respect to the previous embodiment, the end portion 71 of a trench 10 may have a greater distance from an adjacent trench 10.

Figure 30:
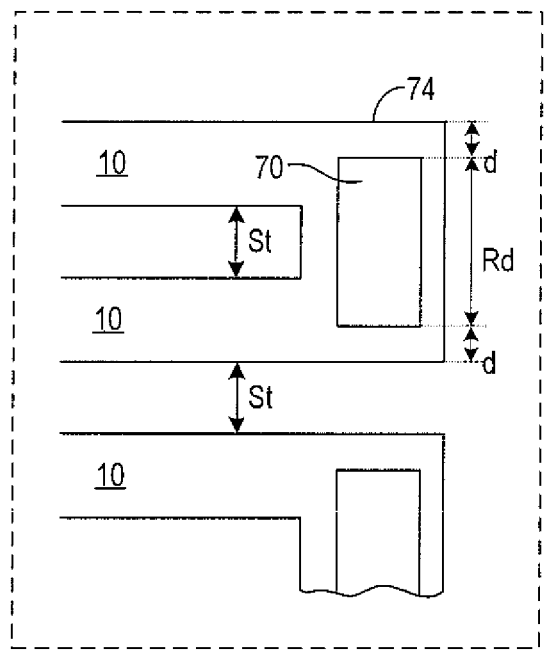

With reference to FIG. 30, an embodiment provides the formation of consecutive pairs of trenches 10 with end portions being coupled to make a common part 74. An embodiment then provides the formation of a single gate contact 70 for both adjacent trenches 10. The single gate contact 70 may be made with a greater width R$_d$ than the previous embodiments and with a same distance d from the respective sidewalls 11 of the two adjacent trenches 10.

Figure 31:
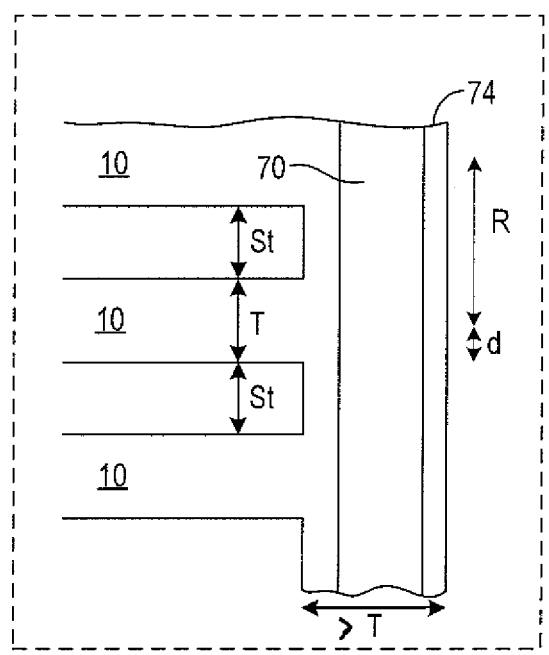

In an embodiment, shown in FIG. 31, a single end portion is formed for a plurality of adjacent trenches 10 in order to make a single common part 74 wherein a single contact gate 70 may be made for the plurality of trenches 10.

The common part 74 may have a width that is greater than the surface width T of each trench 10.

These embodiments allow a gate contact 70 to be made, having such a width as to allow a suitable and sufficient connection with the contacts inside onboard circuitry 50.

According to an embodiment, conveniently defining the values R', R" and R$_d$ and d, only the conductive central region 32 of the gate structure 30 is coupled to the onboard circuitry 50, meanwhile keeping the gate electrode, i.e. the second conductive coating layer 31, outside the underlying gate contact 70 at the distance d.

An embodiment also relates to a power device being manufactured through a method as above described for which particulars and cooperating parts having the same structure and function will be indicated with the same numbers and reference marks.

With reference to FIG. 15, an embodiment of the power device 1 is integrated on a semiconductor substrate 2 comprising a body structure 3 overlapped by appropriate source regions 4. The configuration and arrangement of the body structure 3 and source regions 4 depend on the design requirement and they may be formed in a conventional manner.

The semiconductor substrate 2 has an upper surface 5.

Each elementary MOS transistor included in the power device 1 comprises:

a trench 10, being made in the semiconductor substrate 2, and having sidewalls 11 and a bottom 12.

In the following description reference will be made to a single trench although this expression means at least one trench.

The trench 10 has a higher depth than the body structure 3 and it partially occupies the underlying semiconductor substrate 2.

Moreover, the trench 10 comprises:

a first insulating material coating layer 21 extending along the sidewalls 11 and the bottom 12;

a conductive material gate structure 30 being made inside the trench 10 itself.

Conveniently, the first coating layer 21 is also present on the semiconductor substrate upper surface 5, in correspondence with source regions 4.

The gate structure 30 comprises a second coating layer 31 of a first conductive material extending along the sidewalls 11 of the trench 10, overlapping the first coating layer 21. This second conductive coating layer 31 defines, for each elementary MOS transistor, a gate electrode.

The second conductive coating layer 31 may be a polysilicon layer with a starting thickness s$_p$ being comprised, for example, between approximately 50 nm and 500 nm.

The gate structure 30 may also comprises a conductive filling central region 32, of a second conductive material. The second conductive material of the conductive central region 32 may have a different resistivity than the first conductive material resistivity of the second coating layer 31.

The gate structure 30 provides separation between the gate electrode of each elementary MOS transistor, defined by the second conductive coating layer 31, and a conductive mesh, defined by the conductive central region 32 of the trench 10.

The gate structure 30 may also comprise along the trench sidewalls 11 and interposed between the second conductive coating layer 31 and the conductive central region 32 a plurality of contact areas 27. Each contact area 27 is spaced apart by an appropriate insulating element 26 and it may be filled in with said second conductive material to make a plurality of interconnection conductive bridges 28 between the second coating layer 31 and the conductive central region 32.

As shown, for example, in FIG. 13, the plurality of conductive bridges 28 are a plurality of openings or contact areas 27, with an appropriate width y, while each insulating element 26 has a predetermined and appropriate width x.

The ratio between the width y of each contact area 27 and the width x of each insulating element 26 may be variable for each elementary MOS transistor being made in the power device 1.

This allows, variable-width contact areas 27 with a predetermined layout to be made in order to be able to change a value of a gate resistance R$_g$ of said gate structure 30 for each elementary MOS transistor composing the power device 1.

It may be possible make the gate resistances R$_g$ inside the power device 1 substantially uniform, thus potentially considerably improving the device performances during the switching operation.

Moreover, each trench 10 may have, in correspondence with the bottom 12, on the first coating layer 21, a lower portion 33c of a thick oxide layer 33 LOCOS, which has, a thickness S satisfying the relation S>2*s$_p$, where s$_p$ is, as above indicated, the thickness of the second conductive coating layer 31 being present on the walls 11 of the trench 10. Further upper portions 33a and 33b of the same thick oxide layer 33 LOCOS are present on source regions 4.

Alternatively, in an embodiment shown in FIGS. 20-22, thick oxide layer 33 LOCOS may have a variable thickness S' defined according to design requirements. Moreover, this thick oxide layer 33 LOCOS is, in other words, "virgin", i.e. it is substantially devoid of any contamination deriving from previous process steps and thus, being substantially devoid of any transformation, it may allow the efficiency of the power device obtained to be considerably improved.

The power device 1 may also comprise a silicidized portion 39 being positioned on the conductive central region 32 of the trench 10 and interposed between the upper portions 33a and 33b of the thick oxide layer 33 LOCOS.

Finally, the power device 1 may have an intermediate dielectric layer 40 positioned on the source regions 4 and on the trench 10, as well as appropriate and predetermined metallization layers suitable to define respective source terminals 41 and gate terminals 45.

With reference to FIG. 15, an embodiment of the power device 1 may also comprise onboard circuitry 50 made in correspondence with a preset area of the semiconductor substrate 2.

In an embodiment, the onboard circuitry 50 has two layers 51 and 52 overlapping the selected area, wherein a body region 7 formed in an appropriate ring region 6 is present.

Moreover, the onboard circuitry 50 has the intermediate dielectric layer 40 overlapping the second circuitry layer 52, and the gate terminal 45 being overlapped to the dielectric layer 40. The gate terminal 45 has also appropriate gate contacts 46, extending towards the bottom 12 of the trench 10, in order to contact the conductive central region 32.

Alternatively, an embodiment is shown in FIGS. 18 and 19. This embodiment provides a connection layer 60 comprising a first portion 61 arranged on the upper surface 5 of the semiconductor substrate 2 in contact with the conductive central region 32 of each trench 10 and a second portion 62 at least partially covering the second circuitry layer 52. This connection layer 60 has a substantially step-shaped side configuration.

The connection layer 60 may be of the second conductive material making the conductive central region 32 of each elementary MOS transistor.

As shown in FIG. 19, the connection layer 60 may be overlapped by the intermediate dielectric layer 40 and thus by the gate terminal 45.

With reference to FIG. 24, the power device 1, in an embodiment, comprises a buried strip 80, for example, of the second conductive material, extending crosswise to each trench 10 and included in the upper portions 33a and 33b of the thick oxide layer 33. The buried strip 80 is made so as to contact only the conductive central region 32 of each trench 10. The buried strip 80 defines a gate bus for the power device.

Figure 25:
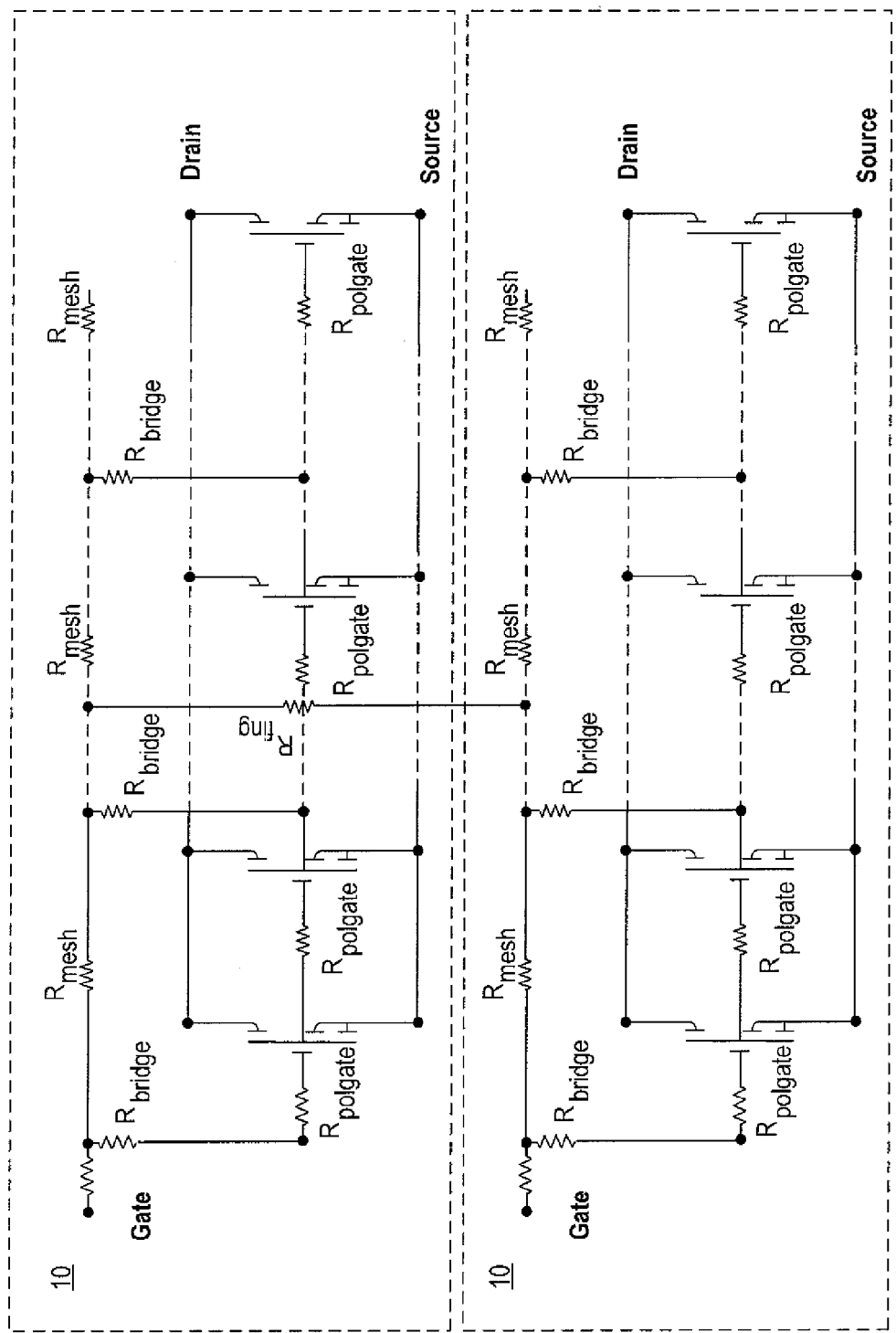
FIG. 25 shows in a circuit diagram the resistances being present in two side-by-side gate structures of a device being manufactured according to the embodiment of FIG. 24.

FIG. 25 shows a portion of a circuit layout showing the resistances being present in the power device 1 manufactured according to an embodiment of the present disclosure, in the embodiment with the buried strip 80, and comprising two adjacent trenches 10.

Each elementary MOS transistor comprising a trench 10 feels the effect of a resistance $R_{mesh}$ of the conductive mesh, defined by the conductive central region 32, of a pair of resistances $R_{polgate}$ of the gate electrode, defined by the second conductive coating layer 31, being present in the sidewalls 11 (in the figure only one trench side is schematized, and thus only one resistance $R_{polgate}$ is shown), of a pair of resistances $R_{bridge}$ of the conductive bridge 28 (in the figure only one resistance $R_{bridge}$ is shown), as well as of a resistance $R_{fing}$ of the conductive bus or buried strip 80 interposed between consecutive trenches 10.

It may be possible to modify and change the resistance $R_{mesh}$ and the pair of resistances $R_{polgate}$, as well as the resistance $R_{bridge}$ for each elementary MOS transistor, by varying not only the resistivity of the two different conductive materials, but also by varying the layout of the plurality of conductive bridges 28. This may allow in particular the total resistance of each elementary MOS transistor in the power device 1 to be made substantially uniform and, moreover, may considerably improve the dynamic performances of the obtained power device 1.

According to an embodiment, the power device 1 comprises end portions of each trench 10 made in such a way as to be able to satisfy specific design requirements.

In particular, as shown in FIG. 26, the power device 1 has the conductive central region 32 of the trench 10 with a surface width T at an interval $S_t$ from the conductive central region 32 of the adjacent trench 10.

In this case, the gate contact 70, in correspondence with the end portion 71 of each trench 10, is a pad having a width R at a distance d from both sidewalls 11 of the trench with a variable length according to design requirements. In each trench 10, the gate contact 70 contacts the conductive mesh, i.e. the conductive central region 32.

According to an embodiment, shown in FIG. 27, each trench 10 has an extension 72 of a sidewall 11 of the trench 10 in correspondence with the end portion 71 so as to have a gate contact 70 with a greater surface width R' than the surface width R of the embodiment shown in FIG. 26 and a same distance d from both sidewalls 11 of the trench 10. The distance $S_t'$ between adjacent trenches 10 in correspondence with the end portion 71, may be smaller than the distance $S_t$ of the embodiment shown in FIG. 26.

In an embodiment shown in FIG. 28, the trench 10 has, in correspondence with the end portion 71 a bottle-neck extension 73, i.e. a same extension 72 for each sidewall 11. In this case, the gate contact 70 may have a greater surface width R" than the width R' of the embodiment shown in FIG. 27 and a corresponding reduction in the distance St" between adjacent trenches 10, with respect to the corresponding distance $S_t'$ of the embodiment shown in FIG. 27.

In an embodiment, shown in FIG. 29, the trench 10 has end portions 71 being misaligned with each other. The end portion 71 may have any of the above-described shapes. In particular, FIG. 29 shows end portions 71 made with a bottle-neck 73, such that there is a greater distance between end portions 71 of adjacent trenches 10.

With reference to FIG. 30, the power device may have pairs of adjacent trenches 10 with end portions being coupled to each other to make a common part 74. In this way, there is a single gate contact 70 for both adjacent trenches 10. The single gate contact 70 may a greater surface width $R_d$ than the previous embodiments and a substantially same distance d from the respective sidewalls 11 of the two consecutive trenches 10.

In an embodiment, shown in FIG. 31, the power device has a single end portion for a plurality of adjacent trenches 10. In this way, there is a single common part 74 with a single gate contact 70 for the plurality of trenches 10. The common part 74 may have a greater width than the surface width T of each trench 10.

These embodiments have a gate contact 70 with such a surface width as to allow a suitable and sufficient connection to the contacts inside the onboard circuitry 50.

By defining the values of surface widths R', R" and $R_d$ and of the distance d, the gate contact 70 can be made to only connect the conductive central region 32 of the gate structure 30 to the onboard circuitry 50, thus spacing the contact 70 from the underlying gate electrode, i.e. the second conductive coating layer 31, by substantially the distance d.

An advantage of an embodiment of the present disclosure is to manufacture a power device with such a trench gate structure as to make a gate electrode and a signal transmission line or conductive mesh being separated from each other and intercoupled by means of preset conductive bridges. Also, an embodiment allows predetermining in a selective way the layout of these conductive bridges, thus allows electrical control of the gate resistance of each MOS transistor included in the power device, thus allowing one to improve the performance during the switching operation.

An embodiment of the power device may be coupled to an integrated circuit (IC) to form a system. The device and IC may be formed on the same or different dies, and the IC may be a controller From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A power device comprising:
   a semiconductor substrate having at least one trench therein defining sidewalls and a bottom;
   a first insulating material coating layer extending along said sidewalls and said bottom of said at least one trench;
   a conductive gate structure in said at least one trench;
   wherein said conductive gate structure comprises a second conductive coating layer comprising a first conductive material extending along said sidewalls of said at least one trench, and a conductive central region comprising a second conductive material being interconnected to said second conductive coating layer, the second conductive material having a different resistivity than said first conductive material; and
   a plurality of contact areas along said sidewalls of said at least one trench and between said second conductive coating layer and said conductive central region, respective insulating elements separating adjacent ones of said plurality of contact areas, and said plurality of contact areas being filled in with said second conductive material.

2. The power device of claim 1, wherein each contact area of said plurality of contact areas has a different width than the width of each of said insulating elements.

3. The power device of claim 2, further comprising, in correspondence with said bottom of said at least one trench over said semiconductor substrate, at the side of said at least one trench, a lower portion and upper portion of an oxide layer respectively.

4. The power device of claim 3, further comprising onboard circuitry including an intermediate dielectric layer arranged over said semiconductor substrate and source terminals and gate terminals and corresponding source-body contacts and gate contacts.

5. The power device of claim 4, further comprising at least a conductive buried strip positioned crosswise to said at least one trench and included in said upper portions of said oxide layer.

6. The power device of claim 4, further comprising a conductive connection layer having a first portion overlapping to said upper portions of said oxide layer and in contact with said conductive central region of said at least one trench and a second portion overlapping to said onboard circuitry.

7. The power device of claim 6, further comprising said gate terminals being positioned on said conductive connection layer and in that said gate contacts contact said conductive connection layer.

8. The power device of claim 4, wherein said at least one trench comprises an end portion near said onboard circuitry suitable to include a gate contact, said end portion having a greater surface width than a surface width of a remaining portion of said at least one trench.

9. The power device of claim 8, further comprising a single end portion for two or more consecutive trenches in order to define a single common part for a single gate contact for such two or more of said trenches.

10. A semiconductor structure, comprising:
    a semiconductor material having a trench therein defining a trench bottom and a trench sidewall;
    a first insulator disposed over the trench bottom and the trench sidewall;
    a first conductor disposed over the first insulator;
    a second insulator disposed within the trench over the first conductor and having at least one opening therein along the trench sidewall;
    a second conductor disposed over the second insulator and extending along the trench sidewall; and
    a plurality of contact areas spaced apart along a same planar side of the trench sidewall between the first conductor and the second conductor and respective insulating elements separating adjacent ones of the plurality of contact areas on the same planar side of the trench sidewall, the plurality of contact areas interconnecting the first conductor and the second conductor through the at least one opening along the trench sidewall.

11. The semiconductor structure of claim 10, wherein a region of the semiconductor material comprises:
    a substrate; and
    an epitaxial layer disposed over the substrate such that the trench extends through the epitaxial layer and into the substrate.

12. The semiconductor structure of claim 10, wherein the second insulator comprises multiple openings; and the first conductor contacts the second conductor through the multiple openings.

13. The semiconductor structure of claim 10, wherein:
    the first conductor has a first resistivity; and
    the second conductor has a second resistivity that is different from the first resistivity.

14. The semiconductor structure of claim 10, further comprising:
    wherein a region of the semiconductor material includes a first surface through which the trench extends and a second surface that is opposite to the first surface;
    a source disposed adjacent to the trench sidewall and to the first surface;
    a body disposed adjacent to the trench sidewall and beneath the source; and
    a drain disposed adjacent to the trench sidewall and beneath the body.

15. The semiconductor structure of claim 14, further comprising circuitry disposed within the region of semiconductor material remote from the source, body and drain.

16. The semiconductor structure of claim 14, wherein the source, body and drain comprises a MOS transistor.

17. The semiconductor structure of claim 16, further comprising a control circuit disposed within the region of semiconductor material configured to control the MOS transistor.

18. The semiconductor structure of claim 16 wherein the source, body and drain comprises an insulated-gate bipolar transistor.

* * * * *